United States Patent [19]
Simmons, Jr. et al.

[11] Patent Number: 5,579,227
[45] Date of Patent: Nov. 26, 1996

[54] LIFT TRUCK DIAGNOSTICS

[75] Inventors: James M. Simmons, Jr., Newark Valley; James W. Davis, Binghamton, both of N.Y.

[73] Assignee: The Raymond Corporation, Greene, N.Y.

[21] Appl. No.: 629,795

[22] Filed: Apr. 9, 1996

Related U.S. Application Data

[63] Continuation of Ser. No. 319,700, Oct. 7, 1994, abandoned.

[51] Int. Cl.⁶ .................................................. G06F 11/32
[52] U.S. Cl. .............................. 364/424.03; 364/424.07; 340/438; 340/461
[58] Field of Search ...................... 364/424.03, 424.04, 364/431.11, 551.01, 424.07; 73/116, 117.2, 117.3; 340/439, 438, 455, 461, 462

[56] References Cited

U.S. PATENT DOCUMENTS

| | | | |
|---|---|---|---|
| 4,521,885 | 6/1985 | Melocik et al. | 371/29 |
| 5,163,001 | 11/1992 | Luke, Jr. | 364/424.02 |
| 5,255,208 | 10/1993 | Thakore et al. | 364/551.01 |
| 5,303,163 | 4/1994 | Ebaugh et al. | 364/550 |
| 5,371,487 | 12/1994 | Hoffman et al. | 340/425.5 |

*Primary Examiner*—Michael Zanelli
*Attorney, Agent, or Firm*—Quarles & Brady

[57] ABSTRACT

The present invention features a diagnostic method for assessing intermittent failures which occur in the components and systems of material handling vehicles. The material handling vehicle of this invention uses an on-board microprocessor and display to allow an operator to determine whether any intermittency is present in the internal systems. The microprocessor is programmed to analyze each system during normal vehicular operation. The program is divided into two vehicular modes, "normal operating" and "program". During the normal operating mode, the vehicle operator is warned of a problem by different audible tones and patterns. A fault code scrolls across the vehicle display screen, indicating the nature of the failure. The program mode can then be entered to assess just where the problem is located. The program mode is divided into three additional modes: "maintenance mode", "configure mode" and "learn mode". The vehicle is selected for maintenance diagnostics during the program mode, and then switched back to the normal operating mode, where the intermittent failures can be diagnosed. The maintenance mode is divided into three diagnostic surveys: output controls, digital input measurements for analyzing switches and encoders, and analog input measurements for testing voltages and potentiometers. Each system in the vehicle can be analyzed by selecting the proper maintenance code.

16 Claims, 3 Drawing Sheets

LIFT TRUCK DIAGNOSTICS

This is a continuation of application Ser. No. 08/319,700 filed Oct. 7, 1994, now abandoned.

RELATED PATENT APPLICATION

The present application is related to co-pending U.S. patent application Ser. No. 08/037,829, filed Mar. 24, 1993, for "A Diagnostic System for a Material Handling Vehicle", assigned to the present assignee, and hereby incorporated by reference.

FIELD OF THE INVENTION

The present invention pertains to the maintenance of material handling vehicles and, more particularly, to a microprocessor-controlled diagnostic system for a lift truck utilizing an on-board microprocessor and display unit for troubleshooting and servicing intermittent vehicular failures during in situ operations.

BACKGROUND OF THE INVENTION

One of the most troubling and difficult problems for a technician servicing any electrical circuit is actually locating and resolving intermittent failures. Nowhere is this problem more difficult than in the maintenance of material handling vehicles. By their very nature, such vehicles receive rough treatment as they move over bumpy terrain, turn sharply, or lift and lower large loads. More than any other similar vehicle, material handling vehicles stress their electrical systems to the limit. Potential failures, which usually register "negative" on a static diagnostic survey, are often further advanced when the material handling vehicle is performing in situ operations, thereby registering "positive".

In addition to the above environmental factors which stress the electrical system through shock and vibration, other factors can affect the integrity or consistency of signals within the system. Examples are moisture condensation on contactors or circuits; radio frequency or electromagnetic interference from devices within the vehicle or the warehouse; and metallic materials which distort or otherwise alter the measured electromagnetic fields surrounding a wire which is tracked by a wire-guided truck. This latter example is of particular importance to well-known types of vehicles which are automatically guided along a path defined by a current-carrying wire embedded in the warehouse floor.

Thus, for purposes of this description, the term "intermittent" is meant to include the aforementioned environmental factors, as well as conventional short circuits and the like.

Recently, the material handling industry has developed built-in diagnostic programming for forklift trucks, so that technicians are no longer required to physically examine the internal circuitry of the vehicles. Programmed diagnostic systems now feature a "hands-off" approach to vehicular-system diagnosis. Dashboard displays indicate potential trouble areas in the equipment on a real-time basis. The vehicle operator is alerted to problems through displays and audible tones while operating the vehicle.

Such visible and audible messages, coupled with other information (in the form of operating and maintenance manuals, the experience of the technician himself, etc.), help a technician make decisions of which a program alone may be incapable.

As aforementioned, the chance of intermittency failure, which could be a momentary short circuit, an open circuit or an abnormal signal variation, is usually intensified during operational tasks, when the vehicle systems are beset by shocks and force loadings or other stressful environmental conditions. Such failures can, more often than not, only be assessed during operation of the vehicle. Static diagnostic testing, therefore, is virtually useless in assessing the intermittency failure.

The present invention addresses the problem of diagnosing intermittent failures and operational abnormalities. The current invention has developed a new program and methodology for locating failures and abnormalities occurring during in situ operations.

SUMMARY OF THE INVENTION

In accordance with the present invention, there is provided a diagnostic method for assessing intermittent failures which occur in the components and systems of material handling vehicles. The material handling vehicle of this invention uses an on-board microprocessor and display to allow an operator to determine whether any intermittency is present in the internal systems. The microprocessor is programmed to display selected system parameters during vehicle operation to allow visual identification of the intermittency.

The vehicular control program is divided into two modes, "normal operating" and "program".

During the normal operating mode, the vehicle operator will be alerted to a problem by different audible tones and patterns. A message will scroll across the vehicle display screen, indicating the nature of the problem. The program mode can then be entered to assess just where the problem is located.

The program mode is divided into three additional modes: "maintenance mode", "configure mode" and "learn mode". Similarly, in the normal operating mode, the operator display functions are divided into three categories: operator-selectable functions, status messages and active maintenance parameters.

The vehicle is selected for maintenance diagnostics during the program mode, and then switched back to the normal operating mode, where the intermittent failures can be diagnosed. The maintenance mode is divided into three diagnostic surveys: output control, digital input measurements for analyzing switches and encoders and analog input measurements for testing voltages. Each system in the vehicle can be analyzed by selecting the proper maintenance mode. The configure mode can be selected in order to adjust vehicular performance requirements or outputs. The learn mode is used to calibrate various system components, such as the throttle potentiometer, lift/lower potentiometer, speed sensor, pressure transducer (weight), etc. Some or all of the various vehicular modes can be accessed only by entering an identification password, so that only qualified personnel can operate or maintain the vehicle.

It is an object of this invention to provide a method by which material handling vehicles can be dynamically tested for intermittent failures.

It is another object of this invention to provide a diagnostic system for testing the various components and systems of a material handling vehicle during in situ operation.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

Generally speaking, the invention features a diagnostic system that is programmed to assess intermittent failures during in situ operation of a material handling vehicle. The diagnostic system is both passively and dynamically operative. In the passive operative mode, the material handling vehicle is tested while its mobility and load handling functions are disabled. In the dynamic operative mode, the vehicle is tested while it is in operation. In situ testing allows the diagnostician to evaluate intermittent failures and abnormalities that ordinarily do not occur during static testing.

Figure 1:
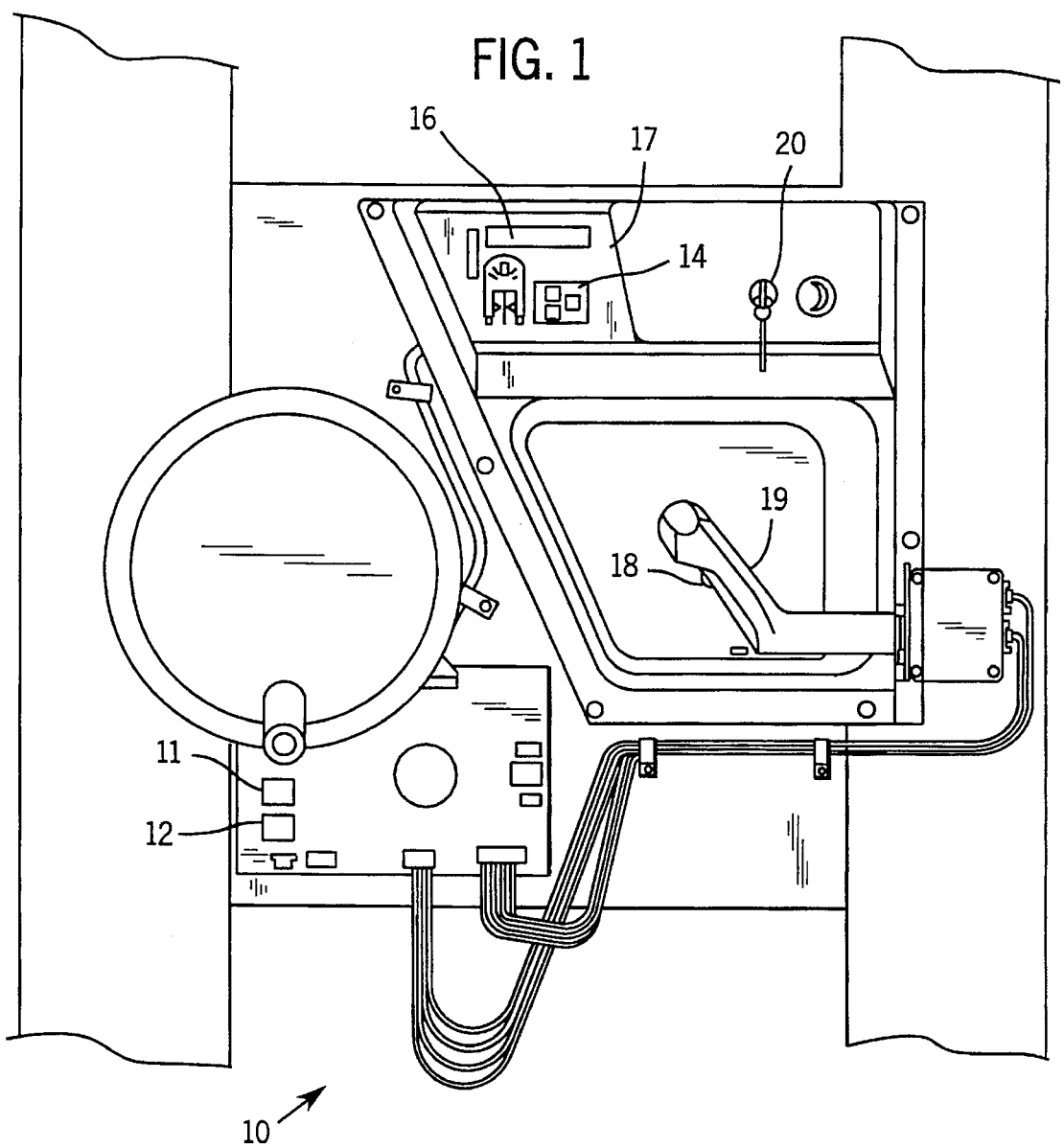
FIG. 1 is a schematic diagram of the vehicle control elements of the system of this invention.

Now referring to FIG. 1, a schematic diagram is shown of the vehicle maintenance system 10. The maintenance system comprises a microprocessor 11 that is programmed with a static, as well as a dynamic, maintenance program 12. The dashboard 17 contains an input device, such as a keyboard 14, which is used for entering codes to access the testing routines of program 12. When a failure is detected by system 10, a particular message is scrolled across an LED portion 15 of display screen 16, as is illustrated in more detail in FIG. 4. The various codes provide information about the source of the failure.

In addition to the visually displayed messages, various audible tones and patterns also help to distinguish the areas of trouble. A horn button 18 on the speed control lever 19, along with keyswitch 20, can be used to switch the running vehicle into the dynamic maintenance mode for intermittent testing, as explained in more detail hereinafter with reference to the diagnostic program 12.

The integrated operator's 8-digit display 16 is used to display information to the operator and service technician. Information is displayed by illuminating icons or by writing messages on the display 16.

The display messages are in English, but other characters can be provided to support French, Spanish, Portuguese, etc. Two message display formats are available: static and scrolling. Static messages are no longer than eight characters (the length of the display 16). The maximum length of a scrolling message, however, is 100 characters, scrolled through the display 16 from right to left at approximately five characters per second.

The display 16 is used to display: Hour Meters/Maintenance Index, Battery State-of-Charge/Voltage, System Faults, Performance Limits, Instructions, Temperature, Clock and Date, Weight, Height and Maintenance Information.

The microprocessor 11 continuously monitors three meter functions: (1) Hours on the Deadman; (2) Hours Spent Lifting; and (3) Traction Maintenance Index, which pertains to the distance traveled.

If the horn button 18 is held in during Startup, then the meters are displayed, sequentially, on the display 16 in the following format:

[1234.5HD]=Hours on Deadman

[1234.5HL]=Hours spent Lifting

[123456TM]=Traction Maintenance Index

The condition of the battery is displayed in one of two ways: Battery Voltage or Battery State-of-Charge.

Battery voltage is the factory default display, if the Time/Date feature has been deleted. It uses the entire 8-digit display 16 to represent the battery voltage. If all eight digits are lit, the battery is assumed to be fully charged; whereas, if all eight digits are off, with only an underscore in the leftmost digit, the battery is assumed to be fully discharged. Since this method simulates a voltmeter, the display 16 decreases and increases as a load is applied and released. There is no lift cutout when the battery voltage level is low.

Battery State-of-Charge is displayed as a percent of state-of-charge remaining until lift cutout. The battery state-of-charge, when enabled, appears on the display 16 instead of the battery voltage.

The battery state-of-charge meter includes the Lift Cutout function. The Lift Cutout default value is 20% and is configurable (in configure mode) between 0% and 50% in 1% increments. The battery state-of-charge is scaled to display the percent charge remaining until lift cutout occurs. The state-of-charge meter is displayed to the nearest 1%.

Example: A Lift Cutout setting of 20%

| Total Battery Energy | Percent Displayed on Display | |
|---|---|---|
| 100% | 100% | |
| 80% | 75% | |
| 60% | 50% | |
| 40% | 25% | |
| 20% | 0% | ** Lift Cutout Occurs |
| 0% | 0% | |

The computer monitors battery voltage to derive the battery state-of-charge. When the truck is inactive (creating little load on the battery), the battery voltage appears to be higher. Thus, the computer could conclude that the battery state-of-charge is rising. To counteract this false rise in state-of-charge, a parameter is provided in configure mode called BSOC, which can be set between 75% and 100% in 1% increments. The computer will not allow the state-of-charge to rise except under two conditions. First, the state-of-charge rises above the BSOC parameter trip point set up in configure mode. Second, the state-of-charge rises 50% or more. This method effectively blocks small false rises in state-of-charge, while allowing battery charging to continue in a normal manner.

When a fault in the system is detected, the microprocessor 11 displays a message on the display 16, sounds an alarm and shuts down the truck in one of several ways: Total System Shutdown, Lift System Shutdown, Lowering System Shutdown, Traction System Derating or Traction System Shutdown.

A Total Shutdown opens the power contactor. This inhibits all Travel, Lift/Lower and Steering functions and applies the brake. The truck sounds a two-tone (hi/low) alarm to indicate Total Shutdown.

A Lift System Shutdown does not open the power contactor. Instead, the lift pump is inhibited, while Lower, Travel, Horn and Steering functions operate normally. The truck sounds a three-tone (hi/med/low) alarm to indicate Lift Shutdown.

A Lower System Shutdown does not open the power contactor. Instead, the Load Holding Solenoid is inhibited, while Lift, Travel, Horn and Steering functions operate normally. The truck sounds a three-tone (hi/med/low) alarm to indicate Lower Shutdown.

A Traction System Derating does not open the power contactor. Instead, the travel system is allowed 20% PWM, or up to 1 mph, while the Lift, Horn and Steering functions operate normally. This allows the truck to be moved out of the way or to the maintenance area. The microprocessor 11 sounds a three-tone (hi/med/low) alarm to indicate Traction System Derating.

A Traction System Shutdown does not open the power contactor. Instead, travel is inhibited, while Lift, Lower, Horn and Steering functions operate normally. The truck sounds a three-tone (hi/med/low) alarm to indicate Traction System Shutdown.

The resultant tones described above repeat only three times. A fault is indicated on the operator display 16 by a code, followed by a scrolling message. The entire message is repeated continuously until the truck is turned off. The "Code 32" message is held on for four seconds, while the "Inform Service" message is scrolled. A fault also flashes the Wrench icon.

Certain performance limit messages can appear on the operator display 16 during normal operation. Under Codes 11 and 13 (Travel Speed Limited due to Temperature) the vehicle's maximum travel speed is reduced, respectively, because the traction motor or the Power Panel is too warm.

Certain instructional messages can also appear on the operator display 16 during normal operation.

1. [Please complete daily check list . . . then fasten safety belt . . .] Vehicle has just completed startup tests.

2. [Release throttle to resume operation . . .] Operator moved the throttle before stepping on the deadman.

3. [Emergency Off button pressed . . . Turn Key OFF/ON . . .] Operator pressed the EPO button.

4. [Initialize to allow full speed . . .] The truck is limited to 1 mph after startup until the lower reference switch is crossed. Battery state-of-charge, or battery voltage or one of the other optional messages is also displayed after every cycle of the phase.

5. [Press lift bypass to continue lifting . . .] The carriage has reached the lift limit switch, not shown, and the operator must press the lift bypass switch to lift past this point. The lift limit icon is illuminated until the lift bypass switch is pressed or the carriage is lowered below the lift cutout height.

When the traction motor or the power panel have overheated, the thermometer icon illuminates and a message scrolls across the display 16 to indicate a traction system shutdown.

Hours, minutes and seconds or the date (year, month and day) are normally displayed. Messages and error codes override this information. Weight is also displayed in 50-pound increments. Height is displayed in 1-inch increments.

Using the "up" and "down" arrows on the keyboard 14, the display 16 can be switched between the different functions (parameters) of time, date, height, weight or an active maintenance test.

All of the active maintenance test values are displayed when enabled and selected.

Figure 2:
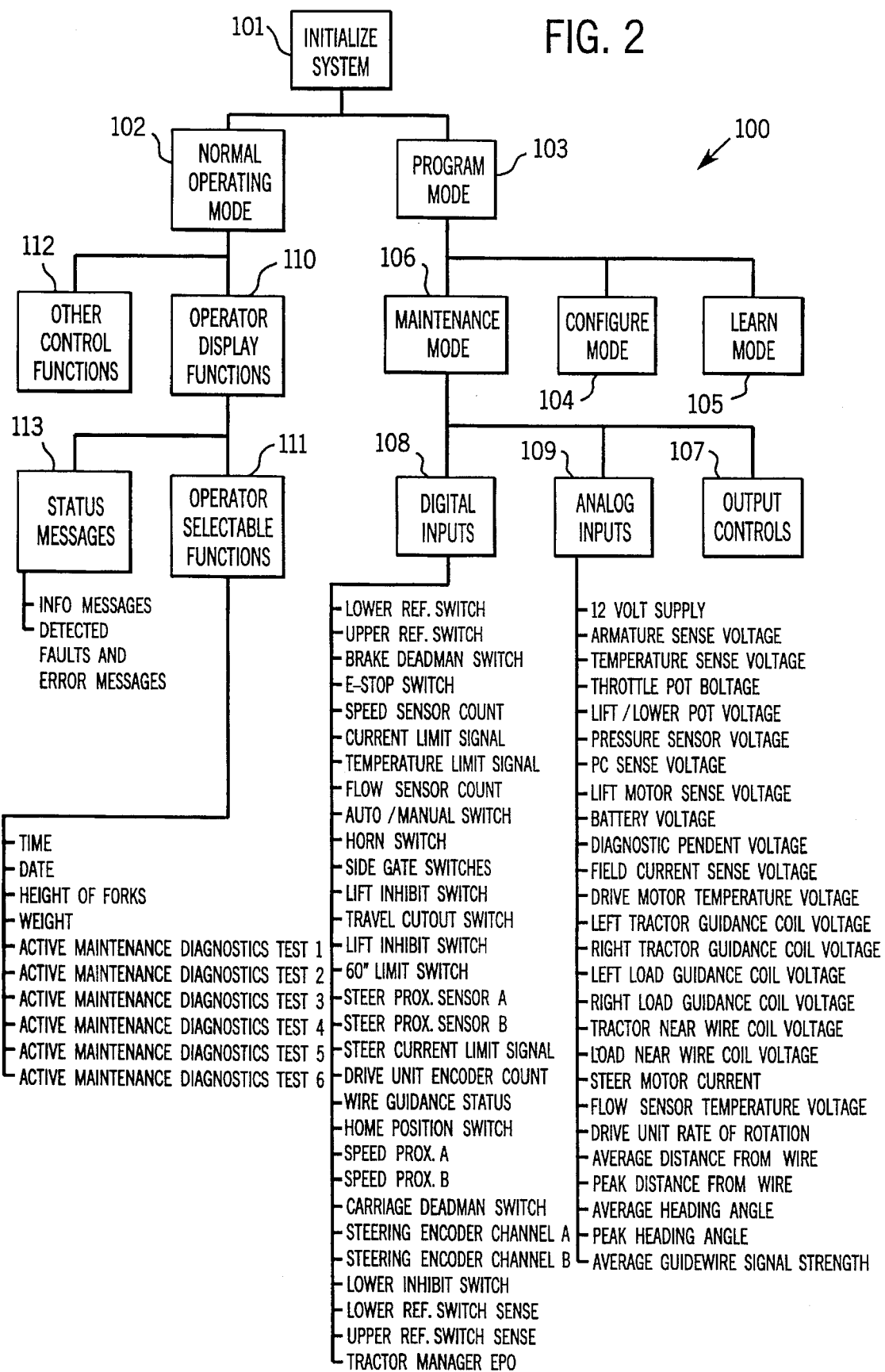
FIG. 2 is a schematic block diagram of the microprocessor-controlled diagnostic system of this invention.

Referring to FIG. 2, a flow chart block diagram 100 of the inventive diagnostic program is shown. When the key is inserted into the keyswitch 20 of the material handling vehicle, the control system is activated and initialized, step 101. The vehicle can now be operated in one of two modes, a "normal operating mode" (block 102) or a "program mode" (block 103), shown in greater detail in FIG. 3, described hereinbelow. The material handling vehicle uses a microprocessor 11, a display 16 and a keyboard 14 (FIG. 1) for determining whether any intermittency is present in the internal systems by selecting the program mode (block 103) of the diagnostic program. The microprocessor 11 is programmed to analyze each system during vehicle operation. In normal operating mode (block 102), the operator display functions (block 110) are used to control and display systems measurement information.

Status messages (block 113) are the types of messages that prompt the operator to perform a particular task (e.g., "Inform Service" or "Cross Upper Reference Switch" or "Cross Lower Reference Switch"). Operator-selectable functions (block 111) are the types of messages that contain specific information for the use of the operator. The operator has the option of continuously displaying any one of the operator-selectable functions (block 111).

All other control functions in the normal operating mode (block 102) are governed by block 112.

During the normal operating mode (block 102), the vehicle operator is warned of a problem by new and different audible tones and patterns. A fault code scrolls across the display screen 16 to indicate the nature of the failure. The program mode (block 103) can then be entered to pinpoint where the problem is located. This program mode (block 103) is divided into three additional modes: "configure mode" (block 104), "learn mode" (block 105) and "maintenance mode" (block 106).

The configure mode (block 104) is selected in order to adjust the vehicular performance requirements or outputs. The learn mode (block 105) is used to calibrate various system components, such as the throttle potentiometer, lift/lower potentiometer, speed sensor, pressure transducer (weight), etc. The maintenance mode (block 106) is chosen to select maintenance diagnostics. The maintenance mode (block 106), in turn, is divided into three diagnostic surveys: output controls (block 107), digital input measurements (block 108) for analyzing switches and encoders, and analog input measurements (block 109) for testing varying voltages. The operator can scroll through the tests, using either the control handle or keypad, and can select up to six active maintenance diagnostics tests. When selected, the address of the test is placed on a list to be used in normal operating mode as an operator-selectable function (block 111). The vehicle is then switched back to normal operating mode (block 102), where any intermittent failures can be diagnosed. Each system in the vehicle can be analyzed by selecting the proper maintenance code. Some or all of the various vehicular modes can be accessed only by entering an identification password, so that only qualified personnel can operate or maintain the vehicle. Other control functions such as lifting and traveling are not accessible under the configure and maintenance modes.

Figure 3:
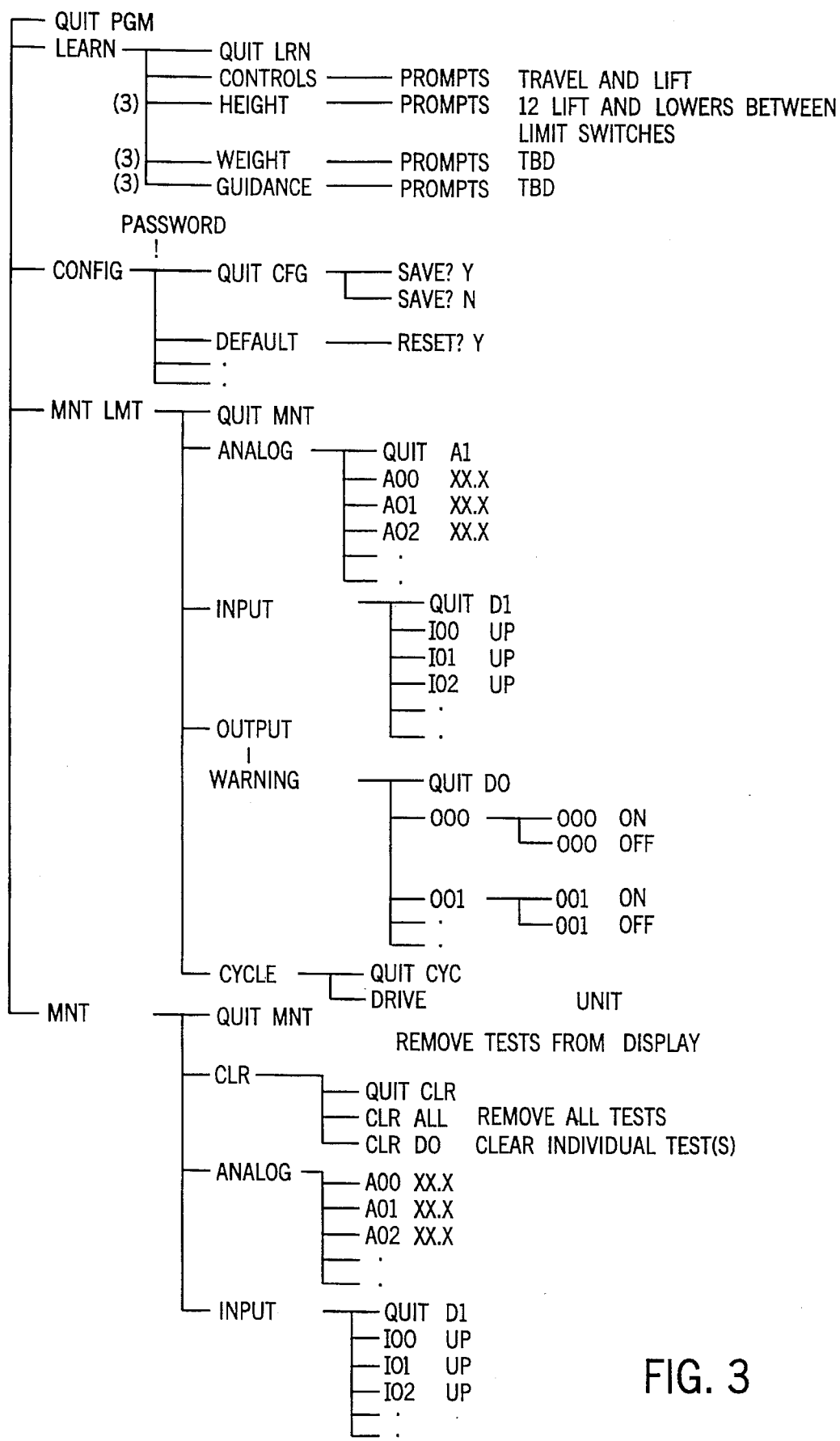
FIG. 3 illustrates the menu structure of the selections possible in the program mode section of the vehicular control program.

FIG. 3 is the menu structure of the selections possible in the program mode (block 103).

Figure 4:
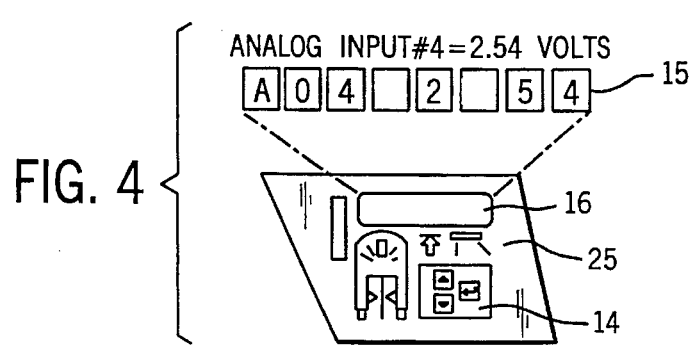
FIG. 4 is a typical display for operating a material handling vehicle.

Referring to FIG. 4, the display 16 for indicating system failures is shown. The display comprises an LED screen 15 which is used to display identification and failure codes. The testing or maintenance codes are entered from the keyboard 14. The display 16 also contains icons 25 of various systems of the vehicle. An icon 25 lights or flashes when a particular failure occurs.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. In a material handling vehicle having a processor which executes a control program to operate the vehicle in either a maintenance mode or a normal operating mode, the improvement therein comprising:

means for monitoring a plurality of vehicle diagnostic parameters;

means operable, while the vehicle is in the maintenance mode, for manually selecting at least one of the diagnostic parameters;

means for storing an indicator for each selected diagnostic parameter, each indicator identifying a corresponding selected diagnostic parameter;

a display for indicating the condition of at least one of the selected diagnostic parameters; and means responsive to the stored-indicators for indicating the condition of at least one selected diagnostic parameter to the display while the vehicle is in the normal operating mode.

2. The improvement of claim 1 wherein the display indicates the condition of each selected diagnostic parameter while the vehicle is in the normal operating mode.

3. The improvement of claim 1 wherein the processor also includes means for monitoring non-diagnostic vehicle parameters and the display also indicates the condition of at least one non-diagnostic parameter.

4. The improvement of claim 1 wherein the display cannot simultaneously display all of the diagnostic parameters and the improvement further includes means for designating, during normal operating mode, which of the selected diagnostic parameters will be displayed.

5. The improvement of claim 4 wherein the display can only display one selected diagnostic parameter at a time.

6. The improvement of claim 1 further including analyzing means receiving the at least one diagnostic parameter and determining the condition of the diagnostic parameter.

7. The improvement of claim 1 wherein the diagnostic parameters are indicated by both digital and analog information and the means for monitoring includes means for monitoring both digital and analog information.

8. The improvement of claim 1 wherein the means for selecting is a keypad.

9. The improvement of claim 8 wherein the keypad can be used to enter an identification code and the improvement includes a means for interrogating an identification code and, where the identification code is acceptable, allowing an operator to alter the manually selected diagnostic parameters.

10. In a material handling vehicle having a processor which executes a control program to operate the vehicle in either a maintenance mode or a normal operating mode, the vehicle including a display and characterized by a plurality of vehicle diagnostic parameters, a diagnostic method comprising the steps of:

a. while the vehicle is in the maintenance mode:
      manually selecting at least one of the diagnostic parameters;
      storing an indicator for each selected diagnostic parameter, each indicator identifying a corresponding selected diagnostic parameter; and b. while the vehicle is in the normal operating mode:
      monitoring all of the vehicle diagnostic parameters; and
      displaying the condition of at least one selected diagnostic parameter on the display.

11. The diagnostic method of claim 10 wherein the step of displaying includes the step of displaying all of the selected diagnostic parameters.

12. The diagnostic method of claim 10 further including the step of monitoring non-diagnostic vehicle parameters and wherein the step of displaying may also include the step of displaying the condition of at least one non-diagnostic parameter.

13. The diagnostic method of claim 10 wherein the display cannot simultaneously display all of the diagnostic parameters and the diagnostic method further includes the step of, during normal operating mode, designating which of the selected diagnostic parameters will be displayed.

14. The diagnostic method of claim 10 further including the step of, before displaying, analyzing the at least one diagnostic parameter and determining the condition of the diagnostic parameter.

15. The diagnostic method of claim 10 wherein the diagnostic parameters are indicated by both digital and analog information and the step of monitoring includes the steps of monitoring both digital and analog information.

16. The diagnostic method of claim 10 wherein the vehicle includes an activating system that allows only authorized operators to enter the maintenance mode of operation, the activating system including means for entering a code and for locking an operator out of the maintenance mode where an incorrect code is entered, the diagnostic method further including the steps of:

prior to the step of manually selecting, entering a identification code;

interrogating the identification code to determine if the code is correct and, where the code is incorrect, locking the operator out of the maintenance mode and, where the code is correct, allowing the operator to alter the selected diagnostic parameters.

* * * * *